(12) United States Patent
Hayashi et al.

(10) Patent No.: US 6,617,664 B2
(45) Date of Patent: Sep. 9, 2003

(54) SEMICONDUCTOR DEVICE HAVING A FUSE AND A FABRICATION PROCESS THEREOF

(75) Inventors: Manabu Hayashi, Kawasaki (JP); Junichi Yayanagi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/124,482

(22) Filed: Apr. 18, 2002

(65) Prior Publication Data

US 2002/0111004 A1 Aug. 15, 2002

Related U.S. Application Data

(62) Division of application No. 09/319,740, filed as application No. PCT/JP98/04581 on Dec. 12, 1998, now Pat. No. 6,399,472.

(30) Foreign Application Priority Data

Oct. 13, 1997 (JP) ............................................. 9-278316
Oct. 29, 1997 (JP) ............................................. 9-297430

(51) Int. Cl.[7] ............................................. H01L 29/00
(52) U.S. Cl. ........................ 257/529; 257/209; 257/665; 257/530; 438/132; 438/238; 438/631; 438/281; 438/128; 438/601
(58) Field of Search ................................ 257/529, 209, 257/665, 530; 438/132, 238, 631, 281, 128, 601

(56) References Cited

U.S. PATENT DOCUMENTS

| | | | |
|---|---|---|---|
| 4,455,194 A | 6/1984 | Yabu et al. | 156/653 |
| 4,862,243 A | 8/1989 | Welch et al. | |
| 5,017,510 A | 5/1991 | Welch et al. | |
| 5,096,850 A | 3/1992 | Lippitt, III | 437/173 |
| 5,235,205 A | 8/1993 | Lippitt, III | |
| 5,585,662 A | 12/1996 | Ogawa | |
| 5,753,539 A * | 5/1998 | Okazaki | 438/132 |
| 5,891,762 A | 4/1999 | Sakai et al. | 438/132 |
| 5,965,927 A * | 10/1999 | Lee et al. | 257/529 |
| 5,970,346 A * | 10/1999 | Liaw | 438/281 |
| 5,989,784 A | 11/1999 | Lee et al. | 430/316 |
| 6,025,214 A * | 2/2000 | Reddy et al. | 438/132 |
| 6,054,339 A * | 4/2000 | Gilmour et al. | 438/132 |
| 6,054,340 A | 4/2000 | Mitchell et al. | 438/132 |
| 6,100,118 A * | 8/2000 | Shih et al. | 438/132 |
| 6,121,073 A * | 9/2000 | Huang et al. | 438/132 |
| 6,162,686 A * | 12/2000 | Huang et al. | 438/281 |
| 6,413,848 B1 * | 7/2002 | Giust et al. | 438/601 |

FOREIGN PATENT DOCUMENTS

| | | |
|---|---|---|
| JP | 58-161361 | 9/1983 |
| JP | 62-89338 | 4/1987 |
| JP | 363307758 A | 12/1988 |
| JP | 1-298738 | 12/1989 |
| JP | 3-50756 | 3/1991 |
| JP | 8-213469 | 8/1996 |
| JP | 9-260601 | 10/1997 |

* cited by examiner

Primary Examiner—Matthew Smith
Assistant Examiner—V. Yevsikov
(74) Attorney, Agent, or Firm—Armstrong, Westerman & Hattori, LLP.

(57) ABSTRACT

In a semiconductor device having a fuse and an etching stopper film covering the fuse, an optical window exposing the etching stopper film and a contact hole exposing a conductor pattern are formed simultaneously. By applying a dry etching process further to the etching stopper film, an insulation film covering the fuse is exposed in the optical window.

5 Claims, 14 Drawing Sheets

SEMICONDUCTOR DEVICE HAVING A FUSE AND A FABRICATION PROCESS THEREOF

This application is a divisional of prior application Ser. No. 09/319,740 filed Jun. 11, 1999, which is a §371 of International Application No. PCT/JP98/04581, now U.S. Pat. No. 6,399,472 and is hereby incorporated by reference filed on Dec. 12, 1998.

TECHNICAL FIELD

The present invention generally relates to semiconductor devices, and more particularly to a semiconductor device having fuse patterns and a fuse window cooperating therewith such that the fuse patterns are selectively blown by irradiating a laser beam through the fuse window.

BACKGROUND ART

With the advancement in the art of device miniaturization, the effect of defective device elements in a semiconductor integrated circuit on the overall production yield of the integrated circuit is increasing. This problem is particularly serious in large-capacity LSI memory devices of very large total number of bits such as 64 Mbit DRAMs (dynamic random access memories). Because of this problem, such large capacity LSI memory devices generally use a redundant construction in which a plurality of redundant memory cell rows or a plurality of redundant memory cell columns are provided in a memory cell array. Further, such a redundant construction generally includes a fuse typically formed of polysilicon. Thus, when a memory cell row or memory cell column containing a defective bit is to be replaced with a redundant memory cell row or a redundant memory cell column, or when to conduct other desired functional selection, it has been practiced to selectively blow a suitable fuse pattern by a laser beam or by an electrical current.

It should be noted that such a fuse pattern is generally surrounded by various semiconductor circuit elements and interconnection layers. In recent highly integrated semiconductor devices, the interconnection layer extends to the region in the vicinity of the fuse pattern, and because of this, there tends to arise the problem of poor planarization in the protective film covering the interconnection patterns in the interconnection layer when the width or pitch of the interconnection layer is reduced. When the planarization of the protective film is thus deteriorated, the step coverage of the interconnection patterns by the protective film is deteriorated, leading to void formation. Such a formation of void in the protective film causes the problem of poor resistance of the integrated circuit against moisture. Thus, in order to improve the resistance against moisture, various efforts are being made to improve the planarization of the protective film by using various protective films.

In the case when a highly planarized protective film is formed to cover the fuse, on the other hand, there inevitably arises the problem of local variation in the thickness of the protective film due to the step caused by the existence of the fuse pattern. In other words, it is difficult to cover the fuse patterns by the protective film with a uniform thickness. Further in view of the recent tendency of increase in the diameter of the semiconductor wafer, the change in the thickness of the protective film over the wafer surface is increasing. Thereby, the thickness of the protective film may change in the semiconductor chips even when the semiconductor chips are obtained from a single wafer. Further, there may be a variation in the thickness of the protective film for the different fuse patterns formed in a single semiconductor chip.

FIGS. 1A–1C show a conventional process of forming a fuse window.

Referring to FIG. 1A, a p-type Si substrate 41 is covered by an oxide film 42 and a plurality of fuse patterns 43 are formed by a patterning process of a polysilicon layer. After the formation of the fuse patterns 43, an $SiO_2$ film 44 is deposited thereon by a CVD process so as to cover the fuse patterns 43, and an Al alloy film is deposited on the $SiO_2$ film 44 by a PVD (physical vapor deposition) process such as a sputtering process or an evaporation deposition process. By patterning the Al alloy film thus deposited, an interconnection pattern 45 and a bonding pad 46 are formed. Next, the $SiO_2$ film 44 is covered by another $SiO_2$ film 47 deposited by a PCVD (plasma CVD) process so as to cover the interconnection pattern 45 and the bonding pad 46, and an SOG film is formed on the $SiO_2$ film 47 by a spin coating process. After a heat treatment process and an etch-back process conducted by an RIE (reactive ion etching) process on the SOG film thus deposited, there is obtained a planarized structure in which the depressed part is filled with an SOG film 48. The SOG film 48 remains also adjacent to the stepped part. Further, a protective film 49 of SiN is deposited on the planarized structure by a PCVD process.

Next, in the step of FIG. 1B, a fuse window 51 and a bonding opening 52 exposing the bonding pad 46 are formed simultaneously in the SiN film 49 by an RIE process while using a resist pattern 50 as a mask, wherein the duration of the etching process is controlled such that an $SiO_2$ film 44 remains on the fuse patterns 43.

Next, in the step of FIG. 1C, the resist pattern 50 is removed and a predetermined electrical interconnection is made at the foregoing bonding opening 52, and a laser irradiation process is conducted subsequently in which a laser beam is applied to a selected fuse pattern 43 corresponding to the necessary redundant circuit via the fuse window 51 such that the selected fuse pattern 43 is blown by the laser beam. The fuse pattern 43 may also be the one that selects a desired circuit function.

In the foregoing conventional process, it should be noted that the thickness of the insulation film remaining on the fuse patterns 43 may change variously due to the local variation in the thickness of the insulation film 44 covering the fuse patterns 43, wherein it should be noted that the foregoing local variation is caused as a result of the foregoing planarization process. When such a variation occurs in the thickness of the insulation film 44 covering various fuse patterns 43, there arises a problem in that some fuse pattern 43 is easily blown up by the laser beam irradiation while some are not. Thereby, it becomes difficult to blow the selected fuse pattern by the laser beam with reliability.

FIGS. 2A–2D show another conventional process of forming a fuse window in which a uniform thickness is guaranteed for the insulation film covering the fuse patterns 43. In FIGS. 2A–2D, those parts corresponding to the parts described previously are designated by the same reference numerals and the description thereof will be omitted.

Referring to FIG. 2A, the fuse patterns 43 of polysilicon are formed on the oxide film 42 covering the p-type Si substrate 41 similarly as in the case of FIG. 1A, and the fuse patterns 43 are covered by the $SiO_2$ film 44 deposited by a CVD process. Further, an Al alloy film is deposited on the $SiO_2$ film 44 by a sputtering process or an evaporation deposition process, followed by a patterning process to form the interconnection pattern 45 and the bonding pad 46, similarly as before. The interconnection pattern 45 and the bonding pad 46 are then covered by the $SiO_2$ film 47 deposited by a PCVD process, and an SOG film is formed on the SiO₂ film 47 by a spin coating process. Next, the SOG film thus deposited is subjected to a curing process, followed by an etch-back process conducted by an RIE process, to form a planarized structure in which the SOG film 48 fills the depressions or steps. Further, the SiN film 49 is deposited on the planarized structure thus obtained by a PCVD process as a protective film.

Next, in the step of FIG. 2B, the fuse window 51 and the bonding opening 52 are formed simultaneously by an RIE process while using the resist pattern 50 as a mask, wherein the fuse window 51 is formed such that the SiO₂ film 44 is removed entirely from the fuse window 51.

In FIG. 2B, it may seem that the exposed surface of the oxide film 42 is entirely flat. In the actual structure, the oxide film 42 experiences an etching action, and because of this, the surface of the exposed oxide film 42 tends to show slight projection or depression reflecting the thickness variation of the insulation film on the fuse pattern 43.

Next, in the step of FIG. 2C, the resist pattern 50 is removed and an SiO₂ film 53 is deposited on the entire structure thus obtained by a CVD process to form a cover film of the fuse patterns 43. In this process, the projections and depressions formed in the oxide film 42 as a result of the previous etching process are filled by the SiO₂ film 53.

Next, in the step of FIG. 2D, the SiO₂ film 53 covering the surface of the bonding opening 52 is selectively removed by conducting an RIE process while using a new resist pattern 54 as a mask, to expose the bonding pad 46. Next, the resist pattern 54 is removed and the electrical interconnection is made at the bonding opening 52. Further, a laser beam is irradiated to a selected fuse pattern 43 corresponding to the desired redundant circuit via the fuse window 51 to blow the same. Similarly as before, the fuse pattern 43 may be the one that selects a desired circuit function.

In this prior art process, it is possible to form the SiO₂ film 53 to have a uniform thickness to some degree, by controlling the condition of deposition. Thereby, it is possible to obtain a generally uniform laser blowing property for each of the fuse patterns or for each of the semiconductor chips.

FIGS. 3A–3C show a further conventional process of forming fuse patterns that uses an etching stopper.

Referring to FIG. 3A, a Si substrate 61 is selectively oxidized to form a field insulation film 62 on the surface of the substrate 61, and an SiO₂ capacitor insulation film 63 is formed on the exposed surface of the Si substrate 61 with a thickness of 100 nm. Next, the structure thus obtained is covered with a polysilicon layer having a thickness of several hundred nanometers, followed by a patterning process to form a polysilicon fuse pattern 64 and a reserve capacitor electrode 65. Next, the part of the capacitor insulation film 63 not covered by the capacitor electrode 65 is removed by an etching process, and an SiO₂ film 66 constituting the gate oxide film is formed so as to cover the fuse pattern 64 and the capacitor electrode 65. Further, a deposition process of a polysilicon layer is conducted on the SiO₂ film 66 such that the polysilicon layer covers the SiO₂ film 66 with a thickness of several ten nanometers. As a result of patterning of the polysilicon layer thus deposited, there are formed a gate electrode 67 and a polysilicon layer 68 covering the polysilicon fuse pattern 64. Further, an ion implantation process of an impurity element is conducted while using the gate electrode 67 as a mask, to form a diffusion region 69.

In the step of FIG. 3A, a CVD process is conducted further to form a PSG film 70 with a thickness of 1 μm, followed by the step of forming a contact hole in correspondence to the source region 69. Further, an Al electrode 71 is formed so as to fill the contact hole formed previously, and a CVD process is conducted again to cover the entire structure by a PSG film 72 with a thickness of 1 μm.

Next, in the step of FIG. 3B, a fuse window 73 is formed in the PSG films 72 and 70 in correspondence to the polysilicon fuse pattern 64 by a dry etching process conducted by using CHF₃ as an etching gas. During this dry etching process, the polysilicon layer 68 functions as an etching stopper.

Next, in the step of FIG. 3C, the polysilicon layer 68 is selectively removed by a dry etching process using CHF₃ as an etching gas, and a dry etching process using the CHF₃ etching gas is conducted again to remove the SiO₂ film 66 covering the polysilicon fuse pattern 64. After this, the polysilicon fuse pattern 64 to be disconnected is blown by supplying an electric current (see Japanese Laid-Open Patent Publication 58-161361).

Depending on the case, the SiO₂ film 66 may be left on the polysilicon fuse pattern 64.

FIGS. 4A–4C show another conventional fabrication process of a polysilicon fuse pattern.

Referring to FIG. 4A, a Si substrate 81 is defined with a predetermined device region 82 and is covered with a first insulation film 83 such that the first insulation film 83 covers the entirety of the Si substrate 81. After the formation of the first insulation film 83, a contact hole is formed in correspondence to the device region 82 and a polysilicon layer is deposited on the entirety of the first insulation film 83 so as to include the contact hole thus formed. By patterning the polysilicon layer thus formed, a polysilicon electrode 84 and a polysilicon fuse pattern 85 are formed. Next, a second insulation film 86 is formed on the entirety of the insulation film 83 with a thickness of 1.0 μm so as to cover the electrode 84 and the fuse pattern 85, followed by the step of forming a contact hole in the second insulation film 86 thus formed, and the contact hole thus formed is covered with a film of Pt. By applying a heat treatment to the Pt film thus deposited at the temperature of about 500° C. a Pt silicide layer 87 is formed in correspondence to the foregoing opening. Next, a Ti film is deposited on the entire surface of the insulation film 86, followed by a patterning process to form a barrier metal film 88 of Ti in correspondence to the foregoing opening. Similarly, a Ti pattern is formed on the polysilicon fuse pattern 85 as a stopper layer 89. Next, the entire surface of the insulation film 86 is covered with Al, followed by a patterning process, to form an Al interconnection layer 90. Thereafter, a third insulation film 91 is deposited so as to cover the interconnection layer 90 with a thickness of 1.5 μm.

Next, in the step of FIG. 4B, there is formed a contact part 92 in the insulation film 91 so as to expose the Al interconnection layer 90 in correspondence to the device region 82. Simultaneously, a fuse window 93 is formed in correspondence to the part where the foregoing stopper layer 89 remains. Thereby, the fuse window 93 exposes the stopper layer 89.

Next, in the step of FIG. 4C, the Ti stopper layer 89 is selectively removed by H₂O₂ in the fuse window 93, and the polysilicon fuse pattern 85 to be disconnected is blown by irradiating a laser beam through the fuse window 93 (see Japanese Laid-Open Patent Publication 3-50756).

Thus, in the conventional proposal of FIGS. 3A–3C or FIGS. 4A–4C achieves a uniform thickness in the insulation film covering the fuse patterns by using an etching stopper.

Thereby, the fuse patterns are blown with reliability by applying thereto a laser beam of a predetermined intensity.

In the semiconductor fabrication process of FIGS. 1A–1C, there arises a problem, associated with the construction not using etching stopper film, in that the control of the RIE process is difficult when forming the window 51. Thereby, there is a tendency that the film thickness distribution of the protective film 49 influences the film thickness of the insulation film 44 remaining on the fuse patterns. When such a variation exists in the thickness of the insulation film 44. the desired reliable laser-blowing of the fuse patterns becomes difficult. Further, the tolerable power band of the laser beam for achieving the desired blowing the fuse patterns is narrowed.

In the process of FIGS. 2A–2D, on the other hand, the laser-blowing of the fuse pattern is certainly improved with regard to the reproducibility as a result of the use of the insulation film 53 in the fuse window. However, the process requires additional steps of forming the insulation film 53 and the etching of the same for forming the bonding opening. Thus, the fabrication process of the semiconductor device is substantially complicated.

In the process of FIGS. 3A–3D that uses the etching stopper film, the reproducibility of the laser-blowing of the fuse pattern is improved. On the other hand, the process requires a complex switching of the etching gases during the etching process of the etching stopper film 68. Associated with this, it is necessary to provide various different gases. Further, the process of forming the bonding opening has to be made separately.

In the process of FIGS. 4A–4C, it is noted that the bonding opening 92 is formed simultaneously. However, the process of forming the bonding opening 92 is a wet etching process not suitable for the fabrication of highly miniaturized semiconductor integrated circuits.

In the case of the process of FIGS. 4A–4C, in which no planarization film such as SOG is used, the insulation film 91 has a generally uniform thickness. On the other hand, in view of the fact that the process does not take into account the effect of distribution of the film thickness, there is no consideration made on what problem may arise when a planarization film, which is used in recent highly miniaturized semiconductor devices, is provided in the process of FIGS. 4A–4C. Even if a dry etching process is combined with this process, there is no substantial teaching derived therefrom about the selection or switching of the etching gases. Thus, it is not clear what advantageous features other than the reliability of laser blowing process may be obtained as a result of such a combination.

In the conventional laser blowing process of the polysilicon fuse patterns 64 or 85, it should be noted that polysilicon constituting the fuse patterns 64 or 85 may scatter and cause a deposition on the side wall of the fuse window. When this occurs, there is a substantial risk that the polysilicon fuse 34 or 55, which has once been blown by the laser beam irradiation, resumes an electrical connection. Alternatively, the scattered polysilicon fragments may cause a short circuit in the adjacent fuse patterns formed in the same fuse window.

FIG. 5 shows the schematical cross sectional view of the polysilicon fuse pattern 64 taken along a longitudinal direction of FIG. 3C.

Referring to FIG. 5, it can be seen that the conductive fragments 75 of polysilicon are deposited on the side wall of the $SiO_2$ film 76 upon laser blowing of the fuse pattern 64, wherein the conductive fragments 75 cause a short-circuit between the polysilicon fuse pattern 64 and the polysilicon layer 68.

DISCLOSURE OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device having fuse patterns and a fuse window cooperating with the fuse patterns, the fuse patterns being selectively blow by a laser beam irradiation, such that the blowing of the fuse pattern is achieved with reliability and reproducibility and such that the semiconductor device has a construction suitable for efficient fabrication.

Another object of the present invention is to provide a fabrication process of a semiconductor device, said semiconductor device comprising a substrate, a fuse pattern formed on said substrate, an etching stopper layer formed over said fuse pattern so as to cover an area in which said fuse pattern is formed, an interlayer insulation film covering said etching stopper layer, a conductor pattern formed on said interlayer insulation film, a protective film formed on said interlayer insulation film so as to cover said conductor pattern, a bonding contact pad formed in said protective film so as to expose said conductor pattern, and a window formed in said protective film in correspondence to said fuse pattern so as to penetrate through said interlayer insulation film and said etching stopper layer, said method including the step of forming said window, said step of forming said window comprising the steps of:

forming a first opening through said protective film and said interlayer insulation film so as to expose said etching stopper layer; and forming a second opening in continuation to said first opening by applying an etching process to said etching stopper layer through said first opening, said step of forming said first opening being conducted concurrently with a step of forming said bonding contact pad.

According to the present invention, the fuse cover film, which covers the fuse patterns and exposed at the fuse window, has a uniform thickness as a result of the process that includes the steps of: covering the fuse patterns by the etching stopper layer; and forming the fuse window in the form of the first and second openings. This advantageous feature is obtained even in such a case in which the planarization film is interposed between the interlayer insulation film and the protective film with a varying thickness. Thereby, the blowing of the fuse patterns conducted by the laser beam through the fuse window is achieved reliably and with excellent reproducibility. Further, the fuse-to-fuse variation or chip-to-chip variation of the fuse blowing property is successfully eliminated. In the foregoing process of the present invention, it should be noted that the formation of the bonding opening and the formation of the first window are conducted simultaneously. Thereby, the number of fabrication steps of the semiconductor device is reduced and the semiconductor device is produced with an increased throughput.

Another object of the present invention is to provide a fabrication process of a semiconductor device, said semiconductor device comprising a substrate, a fuse pattern formed on said substrate, an etching stopper layer formed over said fuse pattern so as to cover an area in which said fuse pattern is formed, an interlayer insulation film covering said etching stopper layer, a conductor pattern formed on said interlayer insulation film, a protective film formed on said interlayer insulation film so as to cover said conductor pattern and a window formed in said protective film in correspondence to said fuse pattern so as to penetrate through said interlayer insulation film and said etching stopper layer, said method including the step of forming said window, said step of forming said window comprising the steps of:

forming a first opening through said protective film and said interlayer insulation film so as to expose said etching stopper layer; and forming a second opening in continuation to said first opening by applying an etching process to said etching stopper layer through said first opening, wherein said step of forming said second opening is conducted such that the thickness of the fuse cover film decreases in said second opening.

According to the present invention, the thickness of the fuse cover film can be reduced as compared with the initial thickness thereof as a result of the etching process used in the step of forming the second opening. This means, in turn, that it is possible to maintain a sufficient thickness for the insulation film that is formed simultaneously with the foregoing fuse cover film. Thereby the stray capacitance pertinent to the insulation film is reduced. Because of the reduced thickness of the fuse cover film, the blowing of the fuse pattern can be achieved by using a low power laser beam.

Another object of the present invention is to provide a fabrication process of a semiconductor device, said semiconductor device comprising a substrate, a fuse pattern formed on said substrate, an etching stopper layer formed over said fuse pattern so as to cover an area in which said fuse pattern is formed, an interlayer insulation film covering said etching stopper layer, a conductor pattern formed on said interlayer insulation film, a protective film formed on said interlayer insulation film so as to cover said conductor pattern, a bonding contact pad formed in said protective film so as to expose said conductor pattern, and a window formed in said protective film in correspondence to said fuse pattern so as to penetrate through said interlayer insulation film and said etching stopper layer, said method including the step of forming said fuse window, said step of forming said fuse window comprising the steps of:

forming said bonding contact pad and simultaneously a first opening through said protective film and said interlayer insulation film, such that said bonding contact pad exposes said conductor pattern;

covering said bonding contact pad by a resist pattern; and forming a second opening in continuation to said first opening by applying an etching process to said etching stopper layer through said first opening.

According to the present invention, it becomes possible to form the second opening in continuation with the first opening in the semiconductor device, in which a multilayer interconnection structure is interposed between the etching stopper layer and the conductor pattern, even in such a case where the etching stopper is not exposed at the first opening in the instance in which the conductor pattern is exposed at the bonding contact pad, by protecting the conductor pattern exposed by the bonding contact pad by using a resist pattern. Thereby, the problem of excessive etching of the conductor pattern at the bonding opening is effectively avoided. As the exposed conductor pattern is thus protected by the resist pattern, it is possible to continue the etching process so as to expose the etching stopper layer at the second opening without problem. By etching the etching stopper layer further, there is formed the fuse window cooperating with the fuse patterns.

Another object of the present invention is to provide a semiconductor device, comprising a substrate, a fuse pattern formed on said substrate, a fuse cover film covering a region where said fuse pattern is formed, an etching stopper layer formed on said fuse cover film, an interlayer insulation film covering said etching stopper layer, and a window formed in said interlayer insulation film so as to penetrate through said etching stopper layer and expose the fuse cover film, said method including the step of forming said fuse window, said interlayer insulation film having a first side wall defining said fuse window, said etching stopper layer having a second side wall defining said fuse window, said second side wall being formed at a position receded with respect to said first side wall.

According to the present invention, there is formed a space in the opening adjacent to the fuse pattern in correspondence to the receded second side wall. Thereby, any fuse fragments formed as a result of the laser blowing of the fuse pattern, are accommodated into the space and the problem of the short circuit caused by the scattered fuse fragments contacting with the etching stopper layer is successfully avoided.

Other objects and further features of the present invention will become apparent from the following detailed description when read in conjunction with the attached drawings.

BEST MODE FOR IMPLEMENTING THE INVENTION

[First Embodiment]

Figure 6A:
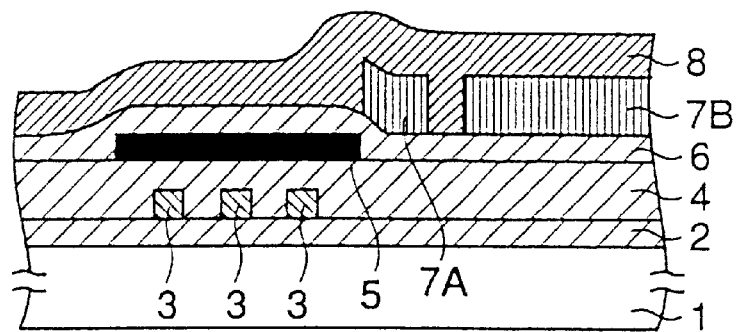
FIGS. 6A–6C are diagrams showing the fabrication process of a semiconductor device according to a first embodiment of the present invention.
Figure 6B:
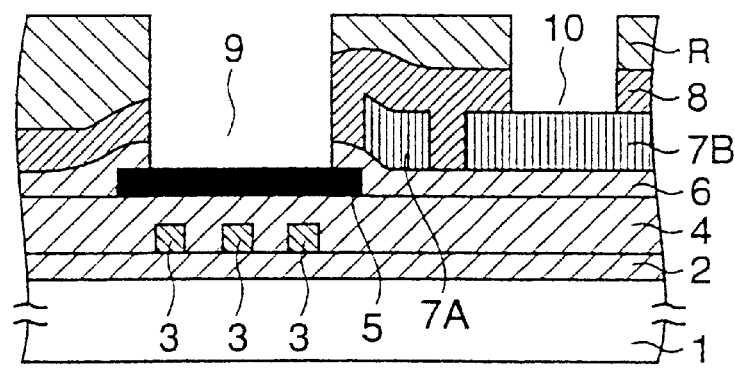
Figure 6C:
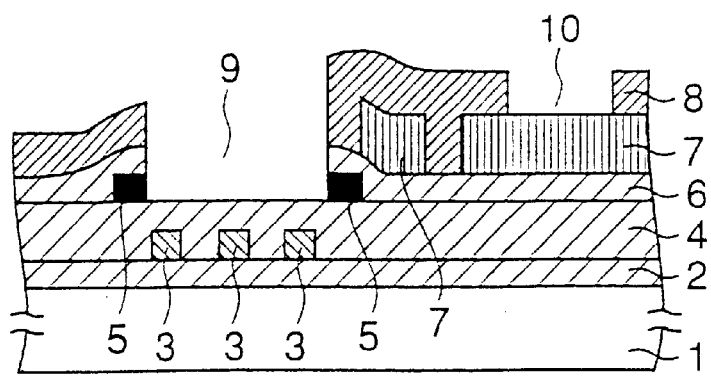

FIGS. 6A–6C show the fabrication process of a semiconductor device according to a first embodiment of the present invention.

Referring to FIG. 6A, there is formed a fuse pattern 3 on an insulation film 2 covering the surface of a Si substrate 1, wherein the insulation film 2 is covered further with an insulation film 4 of $SiO_2$ or BPSG such that the insulation film 4 covers the fuse pattern 3. Further, an etching stopper layer 5 of polysilicon is formed on the insulation film 4 so as to cover the fuse pattern 3, and another insulation film 6 is formed on the insulation film 4 so as to cover the etching stopper layer 5. Further, a conductor pattern 7A and a contact pad 7B typically of an Al-alloy are formed on the insulation film 6, and a passivation film 8 typically of SiN is formed on the insulation film 6 so as to cover the interconnection pattern 7A and the contact pad 7B.

Next, in the step of FIG. 6B, there is formed a resist pattern R having an opening corresponding to the polysilicon fuse pattern 3 and another opening corresponding to the contact pad 7B on the passivation film 8, and the passivation film 8 and the insulation film 6 underlying the passivation film 8 are subjected to a dry etching process while using the resist pattern R as a mask. Thereby, there are formed a fuse window 9 corresponding to the polysilicon fuse pattern 3 and a contact hole 10 exposing the contact pad 7B simultaneously in the passivation film 8 and in the insulation film 6.

It should be noted that the dry etching process of FIG. 6B stops substantially in response to the exposure of the polysilicon etching stopper layer due to the different selection ratio of the etching process. In the case of the present embodiment, the etching process is continued in the step of FIG. 6C, after the resist pattern R is removed, by switching the etching gas to a gas that acts upon Si. Thus, by continuing the etching process of the etching stopper film 5, the fuse window 9 exposes the surface of the insulation film 4.

According to the present invention, it should be noted that the contact hole 10 and the fuse window 9 are formed substantially simultaneously in the step of FIG. 6B. Thereby, the fabrication process of the semiconductor device is substantially simplified as compared with the case in which the fuse window 9 and the contact hole 10 are formed by separate mask processes.

In the step of FIG. 6B, the dry etching process is stopped substantially by the etching stopper film 5. Thus, a substantially flat surface is obtained in the step of FIG. 6C for the insulation film 4 exposed at the fuse window 9. Thus, the energy needed for the laser beam to blow the fuse patterns 3 in the fuse window 9 through the insulation film 4 becomes substantially constant, irrespective of the individual fuse patterns 3. In other words, a laser beam of a constant energy can be used in the fabrication step of the semiconductor device of FIGS. 6A–6C for blowing the fuse 3 positively and with excellent reproducibility.

[Second Embodiment]

FIGS. 7A–7D show the fabrication process of a DRAM according to a second embodiment of the present invention.

Figure 7A:
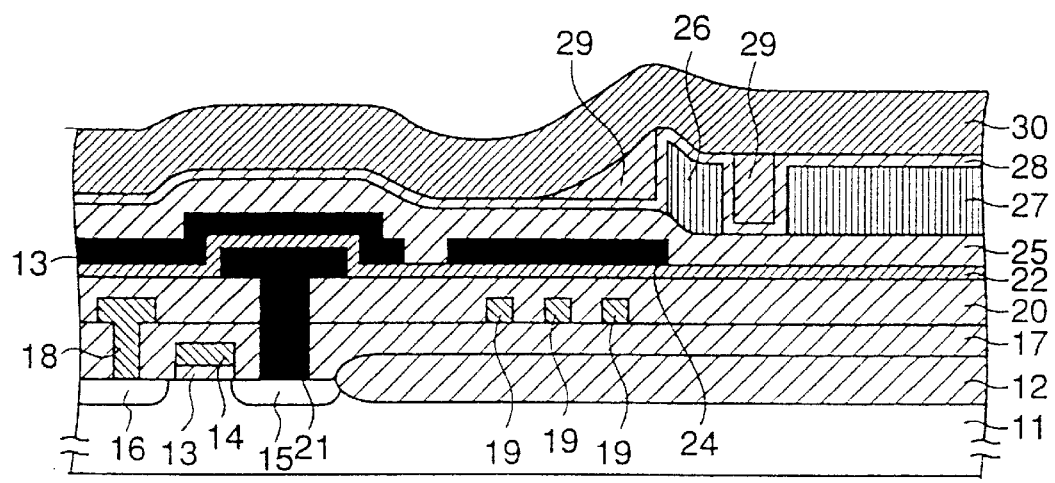
FIGS. 7A–7D are diagrams showing the fabrication process of a semiconductor device according to a second embodiment of the present invention.

Referring to FIG. 7A, a p-type Si substrate 11 is formed with a field oxide film 12 defining a memory cell region by a known wet oxidation process while using a nitride pattern and a pad oxide film (not shown) formed on the substrate 11 as a mask, typically with a thickness of about 500 nm.

In the memory cell region, there is formed a gate oxide film 13 of a memory cell transistor by a thermal oxidation process of the Si substrate 11, and a gate electrode 14 of polysilicon is formed on the gate oxide film 13 as a result of patterning of a polysilicon film. Further, there are formed n-type diffusion regions 15 and 16 by conducting an ion implantation of an n-type impurity element into the memory cell region while using the gate electrode 14 as a mask. It is also possible to form the diffusion regions 15 and 16 to form an LDD structure. In this case, side wall oxide films are formed on the gate electrode 14 after the step of forming the diffusion regions 15 and 16 with the n$^-$ conductivity type, followed by an ion implantation process for forming the n$^+$-type diffusion region, as is well known in the art.

Next, an $SiO_2$ film 17 is formed on the Si substrate 11 with a thickness of about 200 nm so as to cover the field oxide film 12 and the gate electrode 14, by conducting a CVD process at 800° C. Further, a contact hole is formed in the $SiO_2$ film 17 so as to expose the diffusion region 16. Further, a polysilicon film having a thickness of 50 nm and a WSi film having a thickness of 100 nm are deposited consecutively on the $SiO_2$ film 17 so as to include the contact hole, followed by a patterning process to form a bit line pattern 18 and fuse patterns 19.

Further, an $SiO_2$ film 20 is formed on the $SiO_2$ film 17 so as to cover the bit line pattern 18 and the fuse patterns 19 with a thickness of about 500 nm, by conducting a CVD process at 800° C., followed by a step of forming a contact hole in the $SiO_2$ film 20 such that the contact hole exposes the diffusion region 15. Further, a conductive polysilicon film is deposited on the $SiO_2$ film by a CVD process with a thickness of about 250 nm so as to cover the contact hole, followed by a patterning process to form a storage electrode 21 such that the storage electrode 21 contacts with the diffusion region 15 electrically via the contact hole.

Next, an SiN film is deposited on the $SiO_2$ film 20 film such that the SiN film covers the storage electrode 21, followed by a thermal oxidation process to form an insulation film 22 that constitutes the capacitor insulation film. Further, a conductive amorphous silicon film is deposited on the insulation film 22 uniformly with a thickness of about 100 nm. By patterning the amorphous silicon film thus deposited, an opposing electrode pattern 23 is formed so as to oppose the storage electrode 21 via the intervening capacitor insulation film 22 therebetween. Further, an etching stopper pattern is formed as a result of the patterning of the amorphous silicon film such that the etching stopper pattern covers the fuse patterns 19.

Further, a BPSG film 25 is formed on the insulation film 22 by a CVD process with a thickness of about 500 nm such that the BPSG film 25 covers the opposing electrode pattern 23 and the etching stopper pattern 24, followed by a reflowing process conducted on the BPSG film 25 at 900° C. in a $N_2$ atmosphere. During the reflowing process, the opposing electrode pattern 23 and the etching stopper pattern 24 are crystallized and are converted to a polysilicon pattern.

Further, an Al alloy film is deposited on the BPSG film 25 by a sputtering process. By patterning the Al alloy film thus deposited, an interconnection pattern 26 and a contact pad 27 are formed on the BPSG film 25. Further, an $SiO_2$ film 28 is deposited on the BPSG film 25 so as to cover the interconnection pattern 26 and the contact pad 27 with a thickness of about 100 nm by a plasma CVD process conducted at 300° C., followed by a spin coating of an SOG film thereon. After evaporating the solvent from the SOG film by applying heat treatment process at 450° C. in a $N_2$ atmosphere for 30 minutes, an etch-back process is applied to the SOG film by conducting an RIE process acting generally perpendicularly to the principal surface of the substrate 11. Thereby, there is formed an SOG pattern 29 smoothing the stepped edge of the interconnection pattern 26 and the contact pad 27. Further, a passivation film 30 of SiN is formed on the structure thus formed by a plasma CVD process with a thickness of about 1000 nm. By forming the SOG pattern 29 adjacent to the stepped part as such, the problem of void formation, which may occur adjacent to such a stepped part when the stepped part is directly covered by the passivation film 30, is successfully avoided.

Figure 7B:
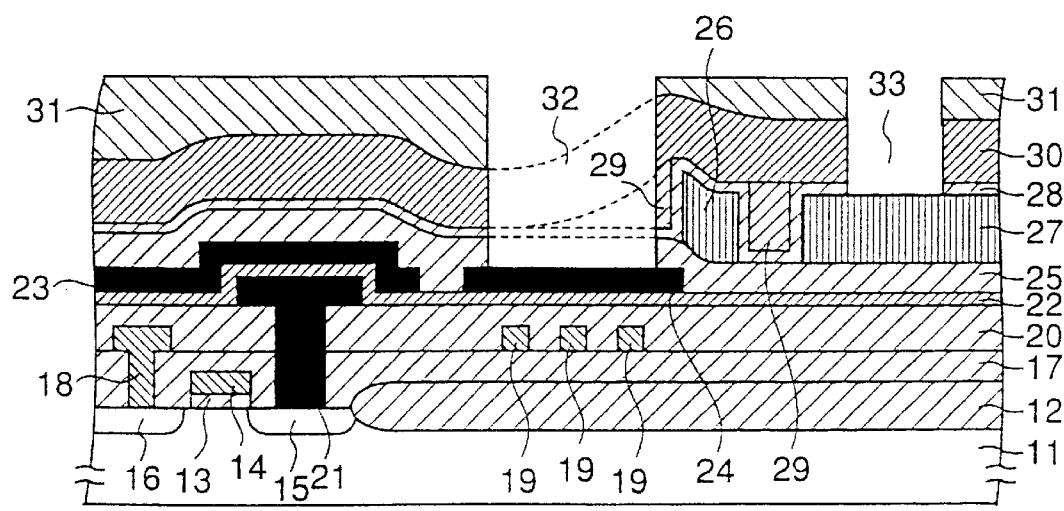

Next, in the step of FIG. 7B, a resist film is deposited on the structure of FIG. 7A, followed by a patterning process to form a resist pattern 31 in which resist windows are formed in correspondence to the fuse patterns 19 and in correspondence to the contact pad 27. By applying a down-flow plasma etching process to the foregoing passivation film 30 and the underlying $SiO_2$ film 28 and further the BPSG film 25 while using the resist pattern 31 as a mask, an opening 32 exposing the etching stopper pattern 24 and an opening 33 exposing the contact pad 27 are formed simultaneously. In the down-flow plasma etching process, a gas mixture of $CF_4/O_2$, in which $CF_4$ and $O_2$ are mixed with a ratio of 1:10, may be used for the etching gas.

In such a plasma etching process, it should be noted that a selectivity of as much as 1:20 can be achieved between the polysilicon etching stopper pattern 24 and the BPSG film 25 formed thereon. Further, a substantially infinite etching selectivity can be reached between the contact pad 27 and the insulation film thereon. Thus, even in such a case there is a substantial variation in the film thickness for the insulation film, particularly the SOG film 29, in the opening 32 as represented by broken lines in FIG. 7B, the bottom surface of the opening 32 is maintained flat due to the existence of the etching stopper pattern 24. Similarly, the bottom surface of the opening 33 is maintained flat as a result of the exposure of the contact pad 27.

Figure 7C:
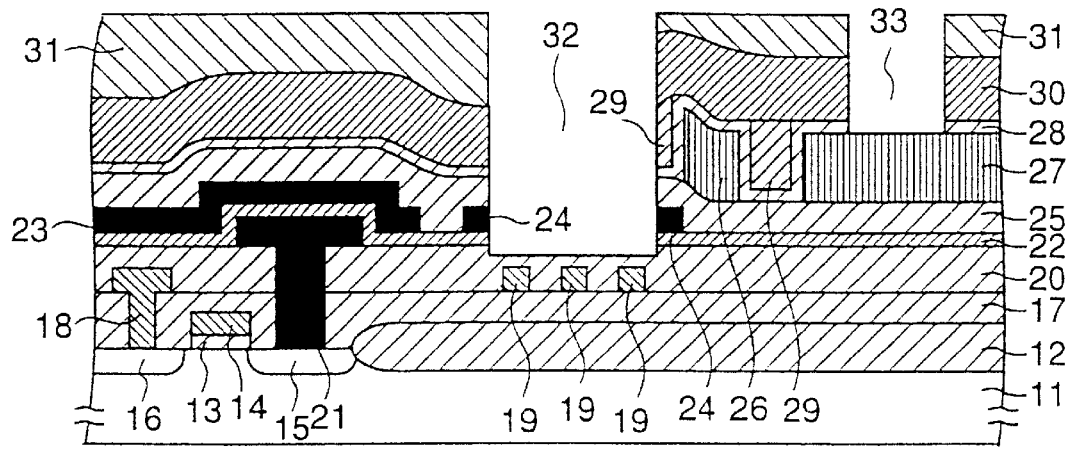

Next, in the step of FIG. 7C, the flow-rate ratio of the etching gas ($CF_4:O_2$) is changed from the foregoing ratio of 1:10 to 10:1, and the polysilicon etching stopper pattern 24 exposed at the opening 32 is removed selectively by the down-flow plasma etching process while using the resist pattern 31 as a mask. As a result of the plasma etching process, the $SiO_2$ film is exposed. In this step, also, it should be noted that the etching of the contact pad 27 does not occur substantially in the opening 33 due to the near-infinite etching selectivity between the etching stopper pattern 24 and the contact pad 27.

Next, in the step of FIG. 7C, the initial flow-rate ratio of $CF_4$ and $O_2$ is resumed and the $SiO_2$ film 20 exposed at the opening 32 is etched with a depth of about 100 nm. Thereby, there is formed a fuse window cooperating with the polysilicon fuse patterns 19 in correspondence to the foregoing opening 32.

Figure 7D:
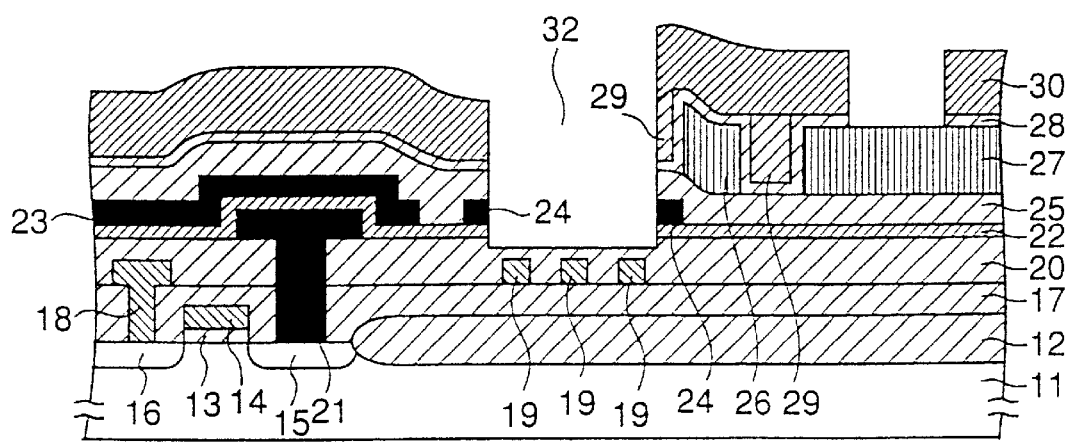

Finally, in the step of FIG. 7D, a laser beam is irradiated through the fuse window 32 thus formed and the fuse pattern 19 corresponding to a desired redundant circuit or a desired circuit function is selectively blown.

In the present embodiment, it should be noted that the thickness of the $SiO_2$ film 20 covering the fuse patterns 19 at the bottom of the fuse window 32 becomes substantially constant as a result of use of the etching stopper pattern 24, even in such a case in which there exists a planarization film such as the SOG film 29 that changes the thickness thereof significantly on the fuse patterns 19. Thereby, the laser-blowing of the desired fuse pattern 19 is achieved with reliability and with excellent reproducibility. As the opening 32 and the opening 33 are formed in the step of FIG. 7B simultaneously by using the same mask, the throughput of production of the semiconductor device is improved substantially. Further, it should be noted that the contact pad 27 is substantially free from etching at the opening 33 even in the step of applying the dry etching process to the foregoing etching stopper pattern 24 at the opening 32 in the step of FIG. 7C. Thereby, a reliable bonding contact is guaranteed at the contact pad 27.

Further, in the present embodiment, it should be noted that the thickness of the $SiO_2$ film 20 covering the fuse patterns 19 in the fuse window 32 can be set as desired. This means that the thickness of the $SiO_2$ film 20 can be set as desired in the fuse window 32 even in such a case in which the thickness of the $SiO_2$ film 20 is increased outside the fuse window 32 for decreasing the stray capacitance of the bit line pattern 18. Thus, the laser-blowing of the fuse patterns 19 can be achieved reliably by using a low-power laser beam. Depending on the initial thickness of the $SiO_2$ film 20, the etching step of the $SiO_2$ film 20 may be omitted.

In the construction of the present embodiment, it is not necessary to form the fuse patterns 19 simultaneously to the bit line pattern 18 but may be formed simultaneously with the word line pattern corresponding to the gate electrode 14. Further, it is not necessary that the fuse patterns 19 have the WSi/Si structure explained before but a stacking structure of other metal silicide of a refractory metal, such as TiSi, MoSi or CoSi, and polysilicon may also be used. Further, the fuse patterns 19 may be formed of a single layer of polysilicon. Furthermore, the fuse patterns 19 may also be formed of amorphous silicon.

Further, it should be noted that it is not necessary to form the etching stopper pattern 24 simultaneously with the opposing electrode 23 but may be formed by using a part of the multilayer interconnection structure interposed between the opposing electrode 23 and the interconnection pattern 26. When the multilayer interconnection structure has a W/TiN/Ti structure, for example, the etching stopper pattern 24 may be formed of a W layer of TiN/Ti layer constituting a part thereof.

Further, in the present embodiment, it is also possible to use TEOS for the planarization pattern 29 in place of SOG.

While the present embodiment has a construction in which the capacitor dielectric film 22 is left in the process of forming the opposing electrode pattern 23 and the etching stopper pattern 24, it is also possible to conduct a patterning of the capacitor dielectric film 22 simultaneously to the patterning of the etching stopper pattern 24 and the opposing electrode pattern 23.

Further, in the step of FIG. 7B for dry etching the insulation film while using the polysilicon pattern 24 as an etching stopper, a dry etching process using a mixture of $CF_4$ and $O_2$ as the etching gas has been used. However, the foregoing dry etching process is by no means limited to such a specific combination of the gases but any other gas system not reacting with the etching stopper pattern 24 or the contact pad 27 of Al-alloy, such as $CF_4$, $CHF_3$, $C_2F_6$, $C_4F_8$, $CH_2F_2$, or a mixture thereof, may also be used. Further, the etching gas may further be added with gases such as Ar, $N_2$, $O_2$ or He. Particularly, the use of a mixture of $CHF_3$ and $O_2$ is preferable other than the foregoing mixture of $CF_4$ and $O_2$.

In the present embodiment, it should further be noted that the dry etching process of FIG. 7C for patterning the polysilicon pattern 24 is conducted by using a mixture of $O_2$ and $CF_4$ as the etching gas. However, the etching gas for the foregoing dry etching process is by no means limited to the foregoing mixture of $O_2$ and $CF_4$ but the gases such as $BCl_3$, $CF_4$, HBr, $SiCl_4$, $Cl_2$, HI, Ar, $N_2$, $O_2$, He, or a mixture thereof may be used. Particularly a mixture of $Cl_2$ and $O_2$ is preferable other than the foregoing mixture of $O_2$ and $CF_4$.

Further, in the present embodiment, it should be noted that the polysilicon etching stopper pattern 24 is in a floating potential state. On the other hand, it is advantageous to clamp the etching stopper pattern 24 to a suitable electrical potential level. By doing so, it becomes possible to detect the scattering of the molten fuse pattern in the laser-blowing process by detecting the contact of the fuse fragments with the etching stopper pattern 24. In the case the operation of the integrated circuit for the part including the fuse patterns 19 becomes unstable due to the influence of the electrical potential applied to the fuse pattern 19 from the adjacent interconnection pattern 26, one may hold the part of the polysilicon pattern 24 surrounding the fuse patterns 19 to a predetermined potential level. By doing so, a guard ring structure is formed around the fuse patterns 19.

Further, it should be noted that the present invention is by no means limited to DRAMs but is applicable also to other semiconductor integrated circuit carrying thereon a logic circuit together with a DRAM, or to general semiconductor integrated circuits in which selection is possible for added functions.

[Third Embodiment]

Figure 8:
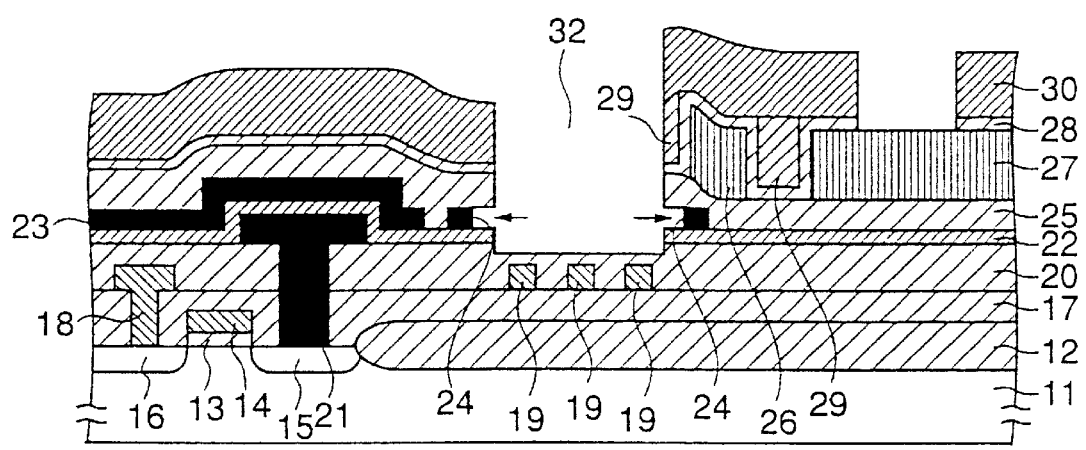
FIG. 8 is a diagram showing the construction of a semiconductor device according to a third embodiment of the present invention.

FIG. 8 shows the construction of a DRAM according to a third embodiment of the present invention, wherein those parts corresponding to the part described previously are designated by the same reference numerals and the description thereof will be omitted.

Figure 1A:
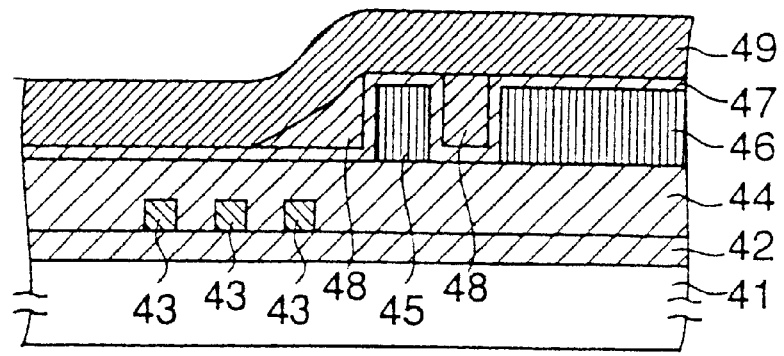
FIGS. 1A–1C are diagrams showing the fabrication process of a conventional semiconductor device having a fuse.
Figure 1B:
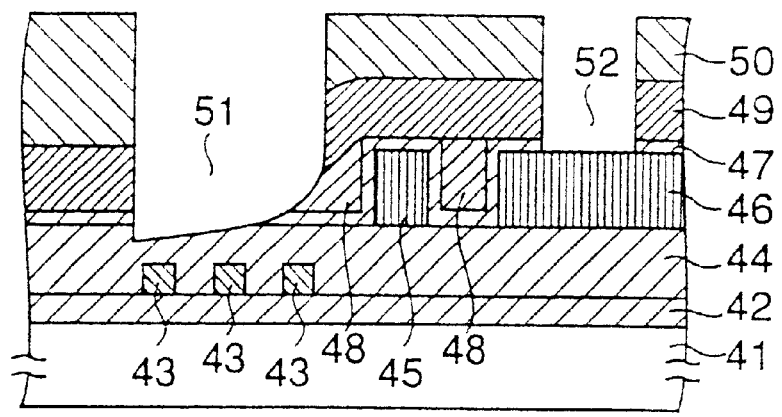
Figure 1C:
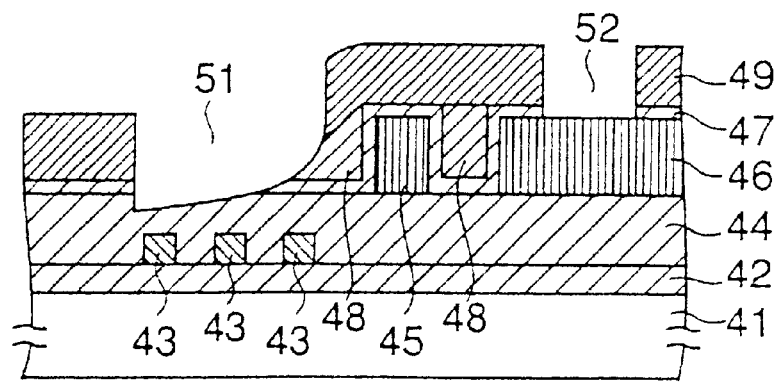
Figure 2A:
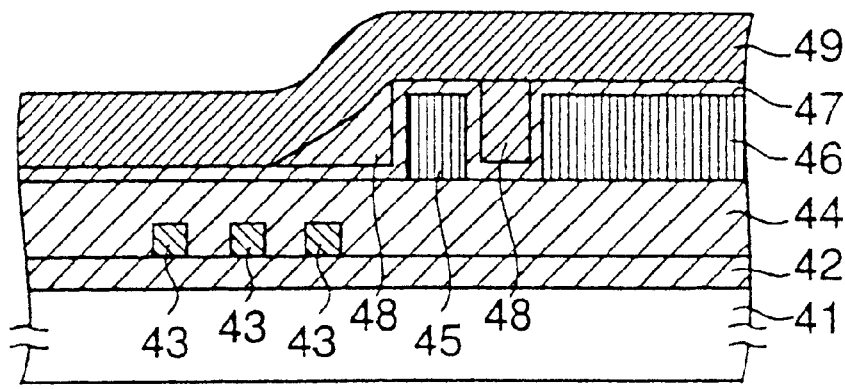
FIGS. 2A–2D are diagrams showing the fabrication process of another conventional semiconductor device having a fuse.
Figure 2B:
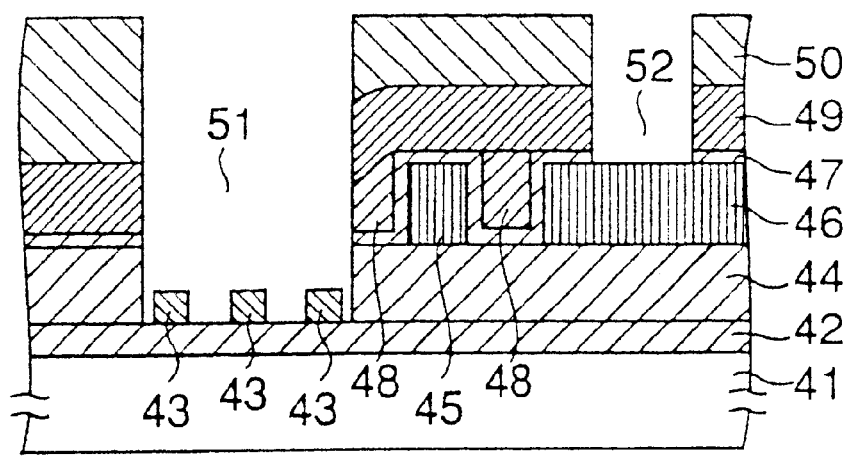
Figure 2C:
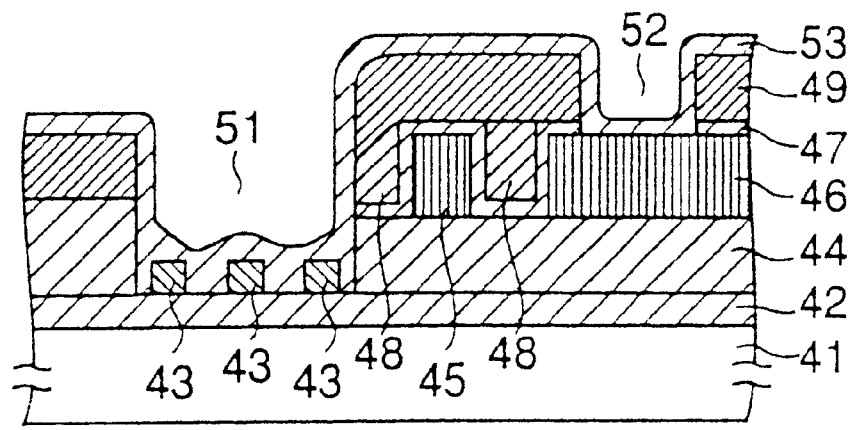
Figure 2D:
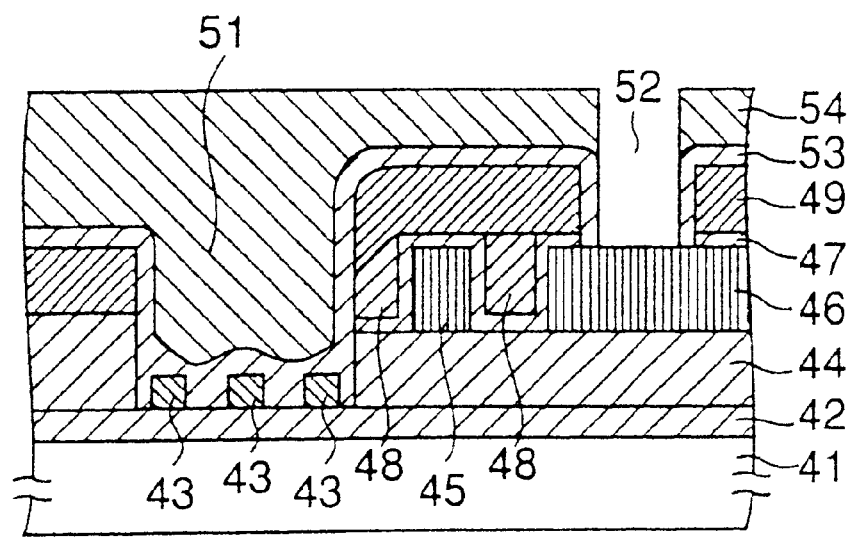
Figure 3A:
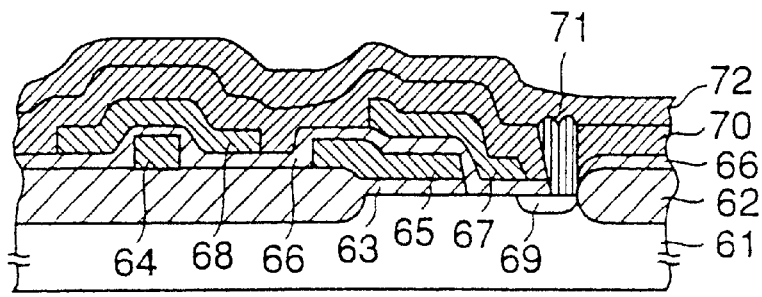
FIGS. 3A–3C are diagrams showing the fabrication process of a further conventional semiconductor device having a fuse.
Figure 3B:
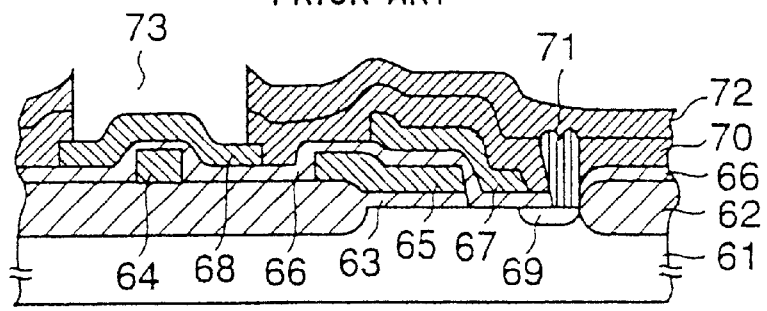
Figure 3C:
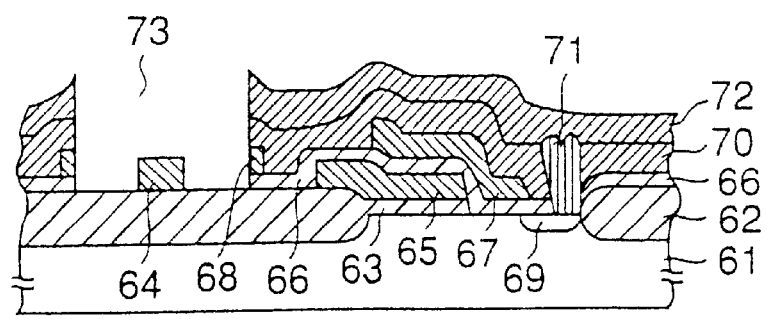
Figure 4A:
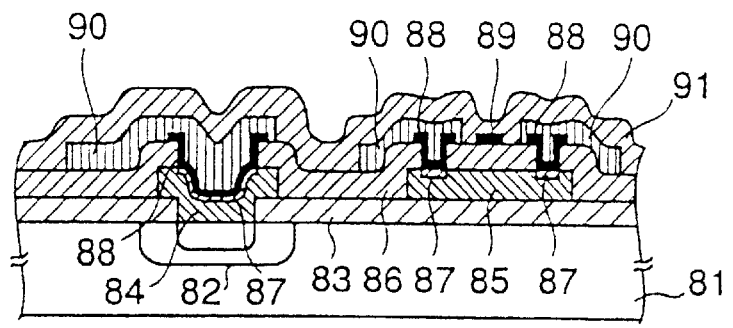
FIGS. 4A–4C are diagrams showing the fabrication process of a still further conventional semiconductor device having a fuse.
Figure 4B:
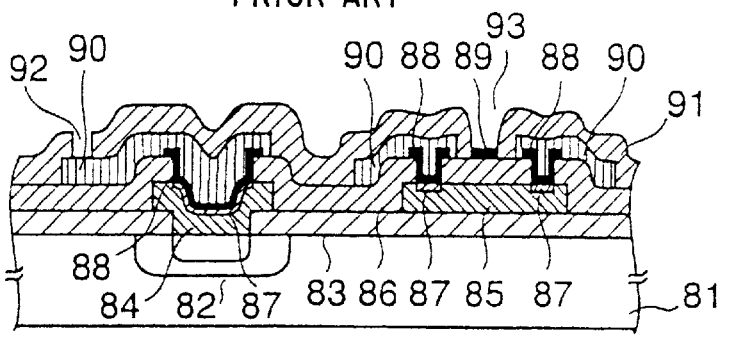
Figure 4C:
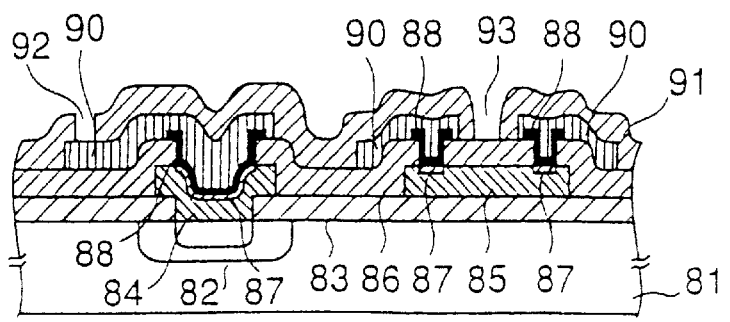
Figure 5:
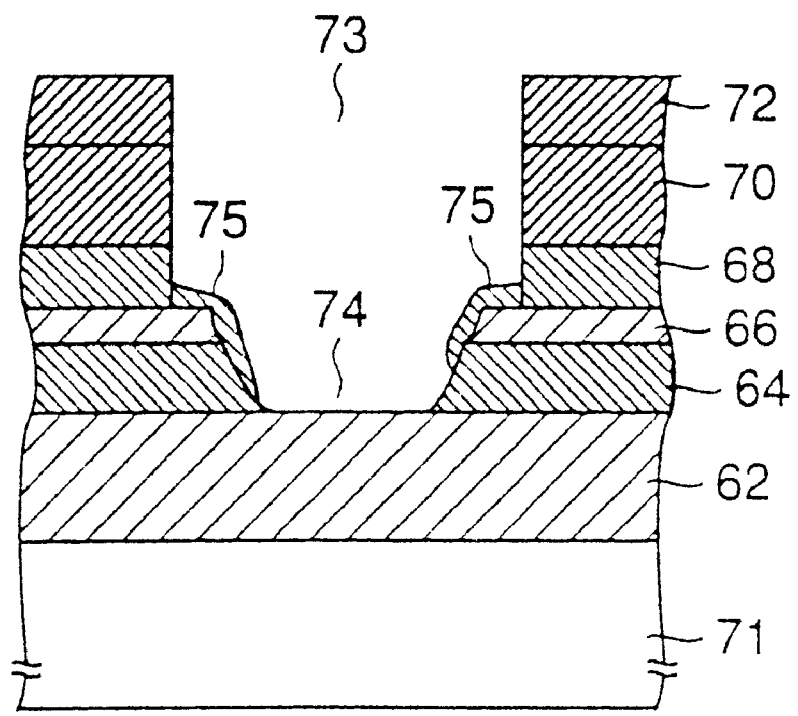
FIG. 5 is a diagram explaining the problem pertinent to the conventional semiconductor device.

Referring to FIG. 8, it will be noted that the side wall of the polysilicon etching stopper film 24 is receded from the side wall of the fuse window 32 as represented by an arrow in FIG. 8. By doing so, there is formed a space suitable for accommodating the fragments of the molten fuse scattered at the time of the laser-blowing process. Thereby, the problem explained with reference to FIG. 5 is successfully eliminated.

FIGS. 9A–9E show the process of forming the structure of FIG. 8 schematically, wherein those parts corresponding to the parts described previously are designated by the same reference numerals and the description thereof will be omitted. In FIGS. 9A–9E, some of the elements represented in FIG. 8 are omitted for the sake of simplicity.

Figure 9A:
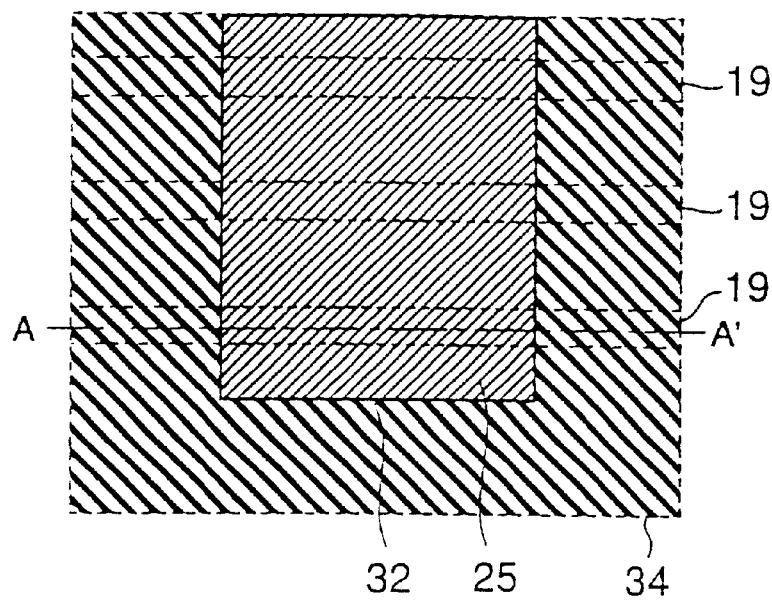
FIGS. 9A–9E are diagrams showing the fabrication process of a semiconductor device of FIG. 8.
Figure 9B:
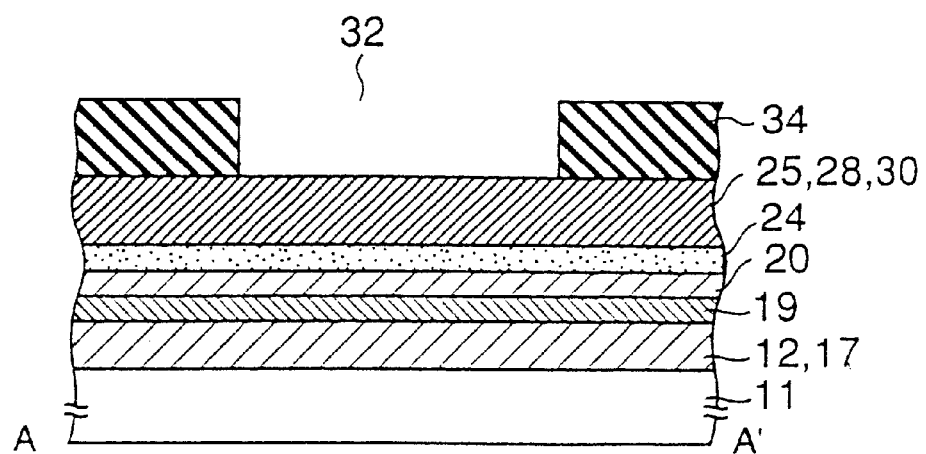

Referring to FIGS. 9A and 9B, FIG. 9A shows the structure of FIG. 9B in a plan view, while FIG. 9B shows the structure of FIG. 9A in a cross-sectional view taken along a line A—A of FIG. 9A.

In the state of FIGS. 9A and 9B, it should be noted that the uppermost layer of the insulation structure formed of the BPSG film 25, the $SiO_2$ film 28 and the passivation film 30, is exposed at an opening formed in the resist pattern 34 in correspondence to the fuse window 32. Further, it should be noted that FIG. 9A also shows the fuse patterns 19 to be formed. As can be seen in FIG. 9A, the fuse patterns 19 extend parallel with the bit line 18.

Figure 9C:
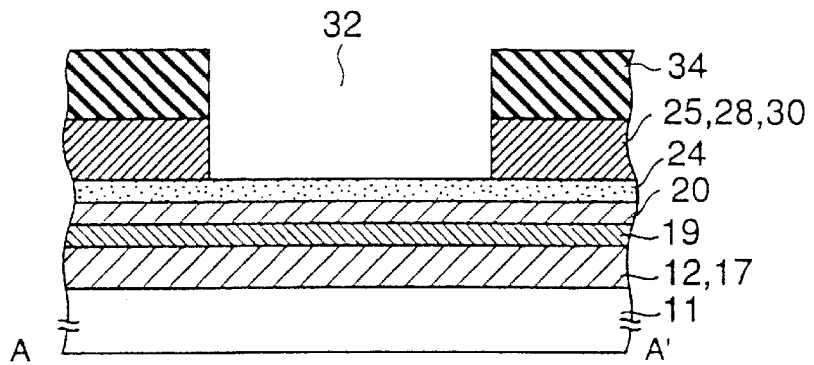

Next, in the step of FIG. 9C, the foregoing insulation structure is subjected to a dry etching process while using the resist pattern 34 as a mask, wherein the dry etching process is typically conducted by an RIE process that uses a freon-family etching gas such as a mixture of $C_4F_8$ and $CH_2F_2$. As a result of the dry etching process, the polysilicon etching stopper pattern 24 is exposed at the opening 32. In this step, it is also possible to use, in addition to the foregoing mixture of $C_4F_8$ and $CH_2F_2$, a mixture of $C_4F_8$ and $CF_4$ diluted with Ar, a mixture of $C_4F_8$ and $CF_4$ diluted with Ar, or a diluted mixture of $C_4F_8$ and $CH_2F_2$ as the etching gas. It should be noted that such freon-family etching gas does not react with the polysilicon etching stopper pattern 24, and there is little risk that the etching stopper pattern 24 is etched.

Figure 9D:
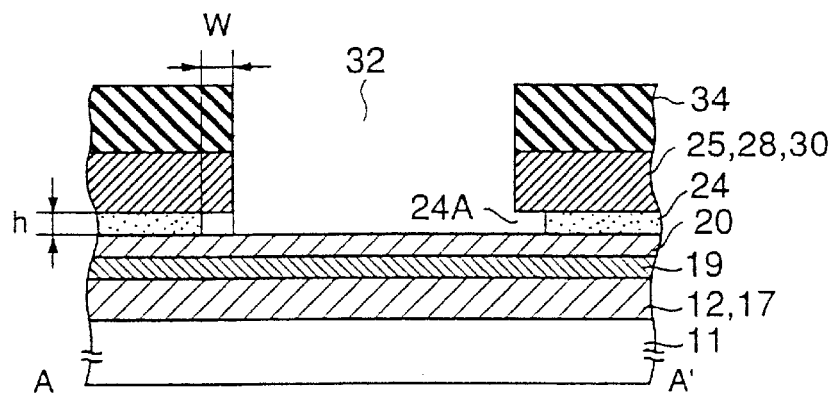

Next, in the step of FIG. 9D, the etching gas is switched to a mixture of $CF_4$ and $O_2$, and the exposed polysilicon film 24 exposed at the opening 32 is etched selectively and isotropically, by conducting a down-flow dry etching process or chemical dry etching process. As a result of the selective and isotropic dry etching process, the side wall of the polysilicon etching stopper pattern 24 recedes with respect to the side wall of the opening by a distance W. Thereby, there is formed a space 24A at the side wall of the foregoing opening 32. In the step of FIG. 9D, it should be noted that the etching time is controlled such that the foregoing distance W exceeds the thickness h of the pattern 24.

It should be noted that the selective and isotropic dry etching process of FIG. 9D can be conducted other than the foregoing gas mixture of $CF_4$ and $O_2$. For example, it is possible to conduct the dry etching process while using a mixture of $NF_3$ and $O_2$, a mixture of $SF_6$ and $O_2$, a mixture of $CF_3$ and $O_2$, or a mixture of $SF_6$ and $O_2$ in which $O_2$ is removed, for the etching gas.

Figure 9E:
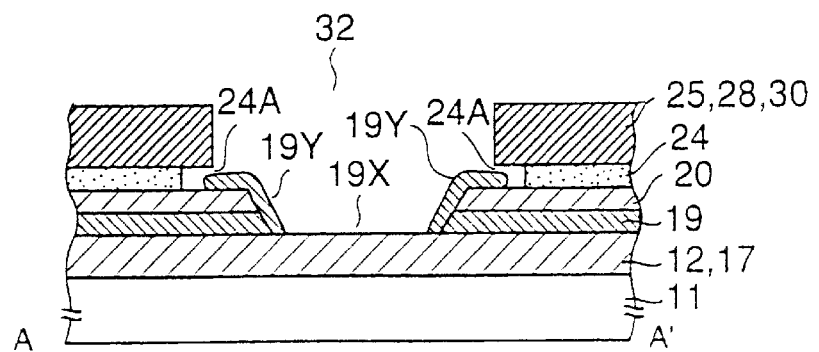

FIG. 9E shows the state in which a laser beam blowing process is applied to the polysilicon fuse pattern thus formed.

Referring to FIG. 9E, the fuse pattern 19 evaporates in response to the irradiation of the laser beam, together with the $SiO_2$ film 20 thereon, and there is formed a disconnection part 19X in the fuse pattern 19. During this laser beam blowing process, the scattered fragments of the fuse pattern form a conductive deposit 19Y in the region surrounding the disconnection part 19X. In the present embodiment, the conductive deposit 19Y is accommodated in the foregoing space 24A and the problem of short-circuit of the conductive deposit 19Y with the polysilicon patter 24 or with other conductor pattern is effectively eliminated.

As explained before, the recess distance W is set larger than the thickness h of the pattern 24. Thus, the recess distance W may be twice as large as the thickness h or more.

[Fourth Embodiment]

Figure 10A:
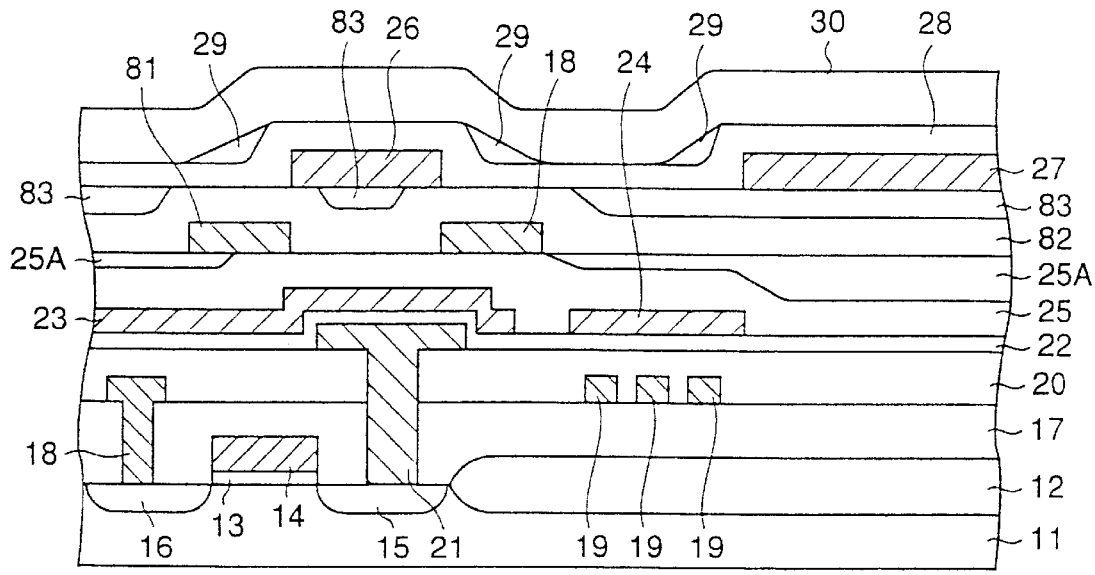
FIGS. 10A–10D are diagrams showing the fabrication process of a semiconductor device according to a fourth embodiment of the present invention.
Figure 10B:
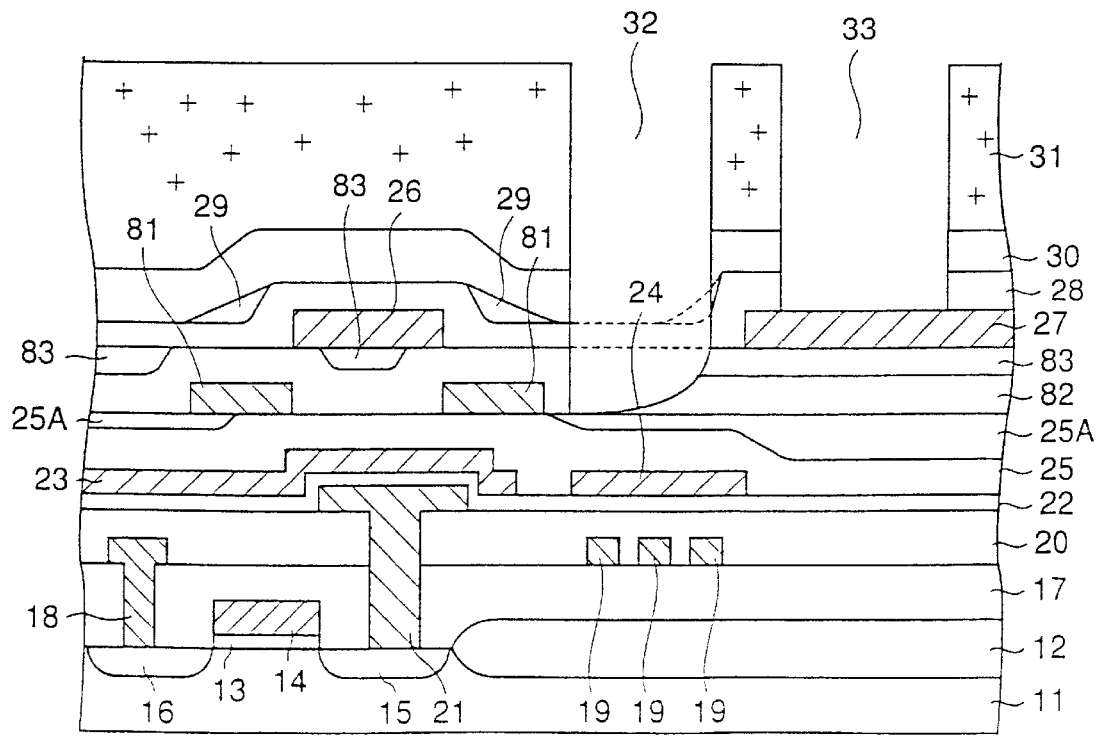
Figure 10C:
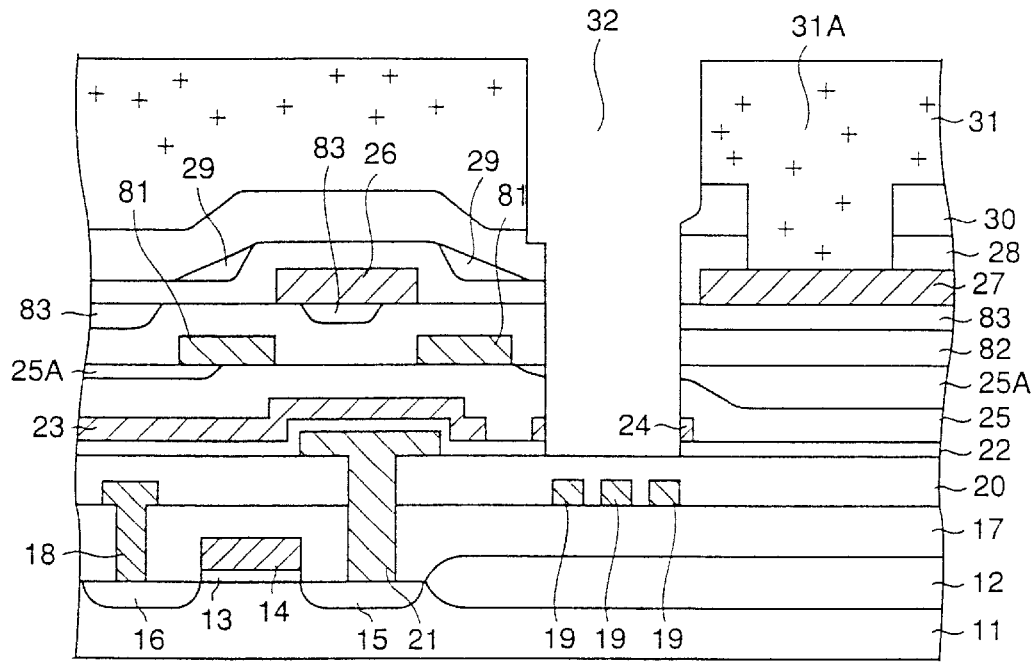

FIGS. 10A–10C show the fabrication process of a DRAM according to a fourth embodiment of the present invention, wherein those parts corresponding to the parts described heretofore are designated by the same reference numerals and the description thereof will be omitted.

Referring to FIG. 10A, the DRAM of the present embodiment has a construction similar to that of the DRAM of the second embodiment, except that a multilayer interconnection structure including an interconnection pattern 81 and an interlayer insulation film 82 are interposed between the BPSG film 25 and the interconnection layer thereon. It should be noted that the interconnection layer includes an interconnection pattern 26 and a contact pad 27. Further, it should be noted that the depression of the BPSG film 25 is filled by an $SiO_2$ pattern 25A that is deposited by a high-density plasma CVD process and planarized subsequently by a CMP (chemical mechanical polishing) process. Further, the depression of the interlayer insulation film 82 is also filled by a similar $SiO_2$ planarization pattern 83. The foregoing interconnection layer is formed on the foregoing interlayer insulation film 82 or 83.

In the structure of FIG. 10A, it should be noted that the difference in the height between the contact pad 27 and the etching stopper pattern 24 increases by the amount corresponding to the multilayer interconnection structure. Thus, when the foregoing openings 32 and 33 are formed while using the resist pattern 31 as a mask, the opening 32 does not reach the polysilicon etching stopper at the instance when the opening 33 has exposed the contact pad 27. Associated with this, the opening 32 may have a bottom surface curved in correspondence to the SOG pattern 29.

Of course, it is possible to continue the dry etching process and extend the opening 32 to the polysilicon pattern 24. However, such an approach causes an excessive etching at the opening 33 and the etching damage on the contact pad 27 is no longer ignorable, in view of possible defect in the bonding made on the contact pad 27.

Thus, in the present embodiment, the resist pattern 31 is removed in the step of FIG. 10C and a new resist pattern 31A is formed such that the resist pattern 31A includes an opening corresponding to the opening 32 and fills the opening 33. By continuing the dry etching process for forming the opening 32 while using the resist pattern 31A as a mask, the fuse window 32 is formed in correspondence to the fuse pattern 19 as represented in FIG. 10C. As the opening 33 is filled by the resist pattern 31A, the problem of excessive etching of the contact pad does not occur in the foregoing dry etching process.

Figure 10D:
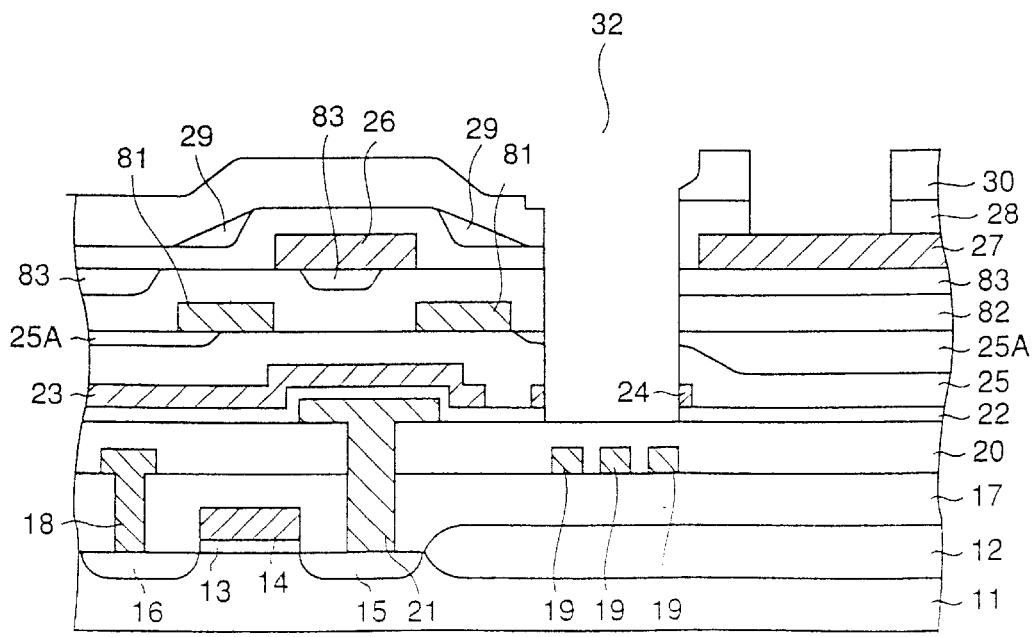

Further, the resist pattern 31A is removed in the step of FIG. 10D.

Thus, in the present embodiment, it becomes possible to form the fuse window 32 stably even in such a case in which the semiconductor device includes a multilayer interconnection structure or when there is a large difference in the height between the polysilicon etching stopper pattern 24 and the contact pad 27. Thus, the present embodiment is particularly suitable for the semiconductor devices having a large integration density and a complex interconnection structure such as a device in which a memory device such as DRAM and a logic device are integrated on a substrate as a monolithic body.

Industrial Applicability

According to the present invention, it becomes possible, in a semiconductor device having a fuse pattern and a fuse window cooperating with the fuse pattern, to blow the fuse pattern through the fuse window by a laser beam reliably, by covering the fuse pattern by an etching stopper film during the process of forming the fuse window. By conducting the step of forming the fuse window and the step of forming the contact hole substantially simultaneously, the fabrication process of the semiconductor device is simplified substantially, and the throughput of production of the semiconductor device is improved. Associated therewith, the cost of production of the semiconductor device is reduced.

Further, by forming the polysilicon film acting as the etching stopper to have a receded side wall at the fuse window, there is formed a space for accommodating the scattered fragments of the fuse, and the problem of short circuit caused by such fuse fragment is effectively suppressed.

In the description theretofore, the present invention has been described with reference to preferred embodiments. However, the present invention is not limited to such specific embodiments and various variations and modifications may be made without departing from the scope of the invention as set forth in claims.

What is claimed is:

1. A semiconductor device, comprising: a substrate, a fuse pattern formed on said substrate, a fuse cover film covering a region where said fuse pattern is formed, an etching stopper layer formed on said fuse cover film, an interlayer insulation film covering said etching stopper layer, and a window formed in said interlayer insulation film so as to penetrate through said etching stopper layer and expose said fuse cover film, said interlayer insulation film having a first side wall defining said fuse window, said etching stopper layer having a second side wall defining said fuse window, said second side wall being formed at a position receded with respect to said first side wall.

2. A semiconductor device as claimed in claim 1, wherein said second side wall is receded from said first side wall by a distance substantially equal to or larger than a thickness of said etching stopper layer.

3. A semiconductor device as claimed in claim 1, wherein said semiconductor device further includes a dynamic random access memory therein, said etching stopper layer being formed between the level of an opposing electrode constituting a memory cell capacitor of said dynamic random access memory and the level of said conductor pattern.

4. A semiconductor device as claimed in claim 3, wherein said fuse pattern is formed in the same level of a word line or a bit line of said memory cell.

5. A semiconductor device as claimed in claim 1, wherein said etching stopper layer is formed at the same level of said opposing electrode.

* * * * *